(12) United States Patent
Shih et al.

(10) Patent No.: US 7,089,472 B2
(45) Date of Patent: Aug. 8, 2006

(54) METHOD AND CIRCUIT FOR TESTING A CHIP

(75) Inventors: Ko-Yan Shih, Taipei (TW); Ming-Hsun Hsu, Taipei (TW)

(73) Assignee: VIA Technologies, Inc., Taipei Hsien (TW)

( * ) Notice: Subject to any disclaimer, the term of this patent is extended or adjusted under 35 U.S.C. 154(b) by 295 days.

(21) Appl. No.: 10/039,852

(22) Filed: Oct. 22, 2001

(65) Prior Publication Data

US 2002/0144203 A1   Oct. 3, 2002

(30) Foreign Application Priority Data

Mar. 28, 2001   (TW) .............................. 90107334 A

(51) Int. Cl.
*G01R 31/28* (2006.01)

(52) U.S. Cl. .................... 714/733; 714/30; 714/31; 714/727; 714/734; 714/799

(58) Field of Classification Search ................ 714/724, 714/727, 726
See application file for complete search history.

(56) References Cited

U.S. PATENT DOCUMENTS

| | | | | |
|---|---|---|---|---|
| 4,860,290 A | * | 8/1989 | Daniels et al. | 714/726 |
| 4,945,536 A | * | 7/1990 | Hancu | 714/727 |
| 5,198,758 A | * | 3/1993 | Iknaian et al. | 714/724 |
| 5,592,493 A | * | 1/1997 | Crouch et al. | 714/729 |
| 6,028,983 A | * | 2/2000 | Jaber | 714/30 |
| 6,178,534 B1 | * | 1/2001 | Day et al. | 714/745 |
| 6,493,840 B1 | * | 12/2002 | Shacham et al. | 714/724 |
| 6,686,759 B1 | * | 2/2004 | Swamy | 324/765 |

* cited by examiner

*Primary Examiner*—Albert Decady
*Assistant Examiner*—John P. Trimmings
(74) *Attorney, Agent, or Firm*—J.C. Patents

(57) ABSTRACT

A circuit for testing a chip. The chip has an intellectual product circuit module, and the circuit has a multiplexer controller, several registers and a MUX finite state machine controller to configure these registers in different states according to the test patterns. In the next state, a test activating signal is provided to the intellectual product circuit module. The intellectual product circuit module is then operated and tested according to the output of the registers.

9 Claims, 4 Drawing Sheets

TITLE: METHOD AND CIRCUIT FOR TESTING A CHIP

CROSS-REFERENCE TO RELATED APPLICATION

This application claims the priority benefit of Taiwan application serial no. 90107334, filed on Mar. 28, 2001.

BACKGROUND OF THE INVENTION

1. Field of the Invention

The invention relates in general to a method and a circuit for testing a chip, and more particularly, the invention relates to a method and a circuit for testing a chip with the time division function.

2. Description of the Related Art

As semiconductor techniques keep advancing, gate counts in a chip increase rapidly. The system on chip (SOC) has become the leading trend in industry. However, pins provided in a chip to test whether the integrated circuits function normally are not sufficient. Various methods and circuits are proposed to resolve the problems of insufficient test pins.

FIG. 1 shows a conventional internal scan chain structure for testing a chip. In the Internal scan chain structure, the multiplexed flip flops MF1 102, MF2 106, MF3 108 MF4 110 and MF5 104 receive the test pattern in series while clocked by a scan clock signal. When the first scan clock is input, an input terminal SI of the multiplexed flip flop MF1 102 receives a first test pattern. When the second scan clock is input, an input terminal SI of the second multiplexed flip flop MF2 106 receives the first test pattern from an output terminal SO of the multiplexed flip flop MF1 102, and the input terminal SI of the multiplexed flip flop MF1 102 receives the second test pattern.

Accordingly, when the fifth scan clock is input, the multiplexed flip flop MF5 104 receives the first test pattern from the output terminal SO of the multiplexed flip flop MF4 110. Meanwhile, the input terminal SI of the multiplexed flip flop MF4 110 receives the second pattern from the output SO of the multiplexed flip flop MF3 108. The input terminal SI of the multiplexed flip flop MF3 110 receives the third pattern from the output SO of the multiplexed flip flop MF2 106. The input terminal SI of the multiplexed flip flop MF2 106 receives the fourth pattern from the output SO of the multiplexed flip flop MF1 102. The input terminal SI of the multiplexed flip flop MF1 102 receives the fifth pattern.

When the system clock is input, the combinational logic circuit 112 receives the system input signal, the combinational logic circuit 114 receives the fifth test pattern output from the output terminal Q of the multiplexed flip flop MF1 102 and the fourth test pattern output from the output terminal Q of the multiplexed flip flop MF2 106, and the the combinational logic circuit 116 receives the third test pattern output from the output terminal Q of the multiplexed flip flop MF3 108, the second test pattern output from the output terminal Q of the multiplexed flip flop MF4 110, and the first test pattern output from the output terminal Q of the multiplexed flip flop MF5 104 so that the combinational logic circuits 112, 114, 116 can be tested for their circuit functions.

Next, the execution result of the combinational logic circuit 112 is input to the input terminals D of the multiplexed flip flop MF1 102 and the multiplexed flip flop MF2 106. The execution result of the combinational logic circuit 114 is input to the input terminals D of the multiplexed flips flops MF3 108, MF4 110 and MF5 104.

However, when the next scan clock is activated, the output terminal SO of the multiplexed flip flop MF5 104 outputs a first test result. Meanwhile, the output terminal SO of the multiplexed flip flop MF4 110 outputs a second test result to the input terminal SI of the multiplexed flip flop MF5 104. The output terminal SO of the multiplexed flip flop MF3 108 outputs a third test result to the input terminal SI of the multiplexed flip flop MF4 110. The output terminal SO of the multiplexed flip flop MF2 106 outputs a fourth test result to the input terminal SI of the multiplexed flip flop MF3 108. The output terminal SO of the multiplexed flip flop MF1 102 outputs a fifth test result to the input terminal SI of the multiplexed flip flop MF2 106. Accordingly, at the fifth scan clock, the output terminal SO of the multiplexed flip flop MF5 104 outputs the fifth test result.

Thus, the chip is tested with an internal scan chain. The above steps can determine whether the circuit modules in the chip function normally. However, a set of different test patterns have to be input when testing one of the circuit modules. In order to complete the whole test, a large number of test patterns are required.

Furthermore, the test patterns generated for testing the chip have to be changed whenever the circuit modules of the chip change. The launch of the product has to be deferred, and the cost is increased additionally. Further, the multiplexed flip flops occupy a great area in the chip and thus are not economic.

A block diagram of boundary scan in another conventional method for testing a chip is shown in FIG. 2. In FIG. 2, a boundary scan method is used to test logic circuits 202, 204, 206 and 208 with several boundary scan cells 210 arranged therearound.

In FIG. 2, 6 boundary scan cells are arranged around each logic circuit. The boundary scan cells are connected in series, and receive each test pattern serially. When all the boundary scan cells have received the test patterns, the test patterns are sent to all of the logic circuits in parallel. The test results of the logic circuits are received in parallel. The test results are then output one by one in series.

The chip is tested using the boundary scan method. The function of the circuit module of the chip can be tested by the above steps. However, as the test patterns required for all the logic circuits are received or output in series, the time consumption of this operation is significant.

Moreover, the test patterns generated and modified for testing a chip have to be changed as the circuit modules change. The launch of the product has to be deferred. In addition, the multiplexed flip flops occupy a large area of the chip. Again, this is not economic at all.

The relative literature of the boundary scan includes: 1. "Boundary-Scan Test: A practical approach" by Harry Bleeker, Peter Van Den Eijnden, Frans De Jong/Hardcover/ Kluwer Acamedic Publishers, January 1993; 2. "The Test Access Port and Boundary-Scan Architecture" by Colin M. Maunder, Rodham Tulloss/Harcover/IEEE Computer Society Press, January 1991.

SUMMARY OF THE INVENTION

The invention provides a method and a circuit to test a chip. The method and the circuit can easily generate test patterns to test the chip with a reduced test time for modifying the test patterns. As a result, the test cost is reduced. Without trading off the performance of the chip, the required chip area of the test circuit is minimized. The test circuit can be easily applied to the integrated circuit of the chip.

The method of testing a chip provided by the invention includes the following steps. The chip comprises an intellectual product circuit module. A test pattern is provided. A plurality of registers is configured according to different states. In a next state, a test activating signal is sent to the intellectual product circuit module. The intellectual product circuit module is operated for testing.

The circuit of testing a chip provided by the invention comprises several registers and a MUX state finite controller. The chip comprises an intellectual product circuit module. The registers are coupled to the intellectual product circuit module to output the stored signals thereto. The MUX state finite controller is coupled to the intellectual product circuit module and the registers. The MUX finite state machine controller receives a test pattern and configures the test pattern in different states. In the next state, a test activating signal is provided to the intellectual product circuit module, which is then operated and tested according to the output of the registers.

In another embodiment of the invention, a circuit of testing a chip includes a multiplexer controller, several registers and a MUX finite state machine controller. The chip comprises several intellectual product circuit modules. The multiplexer controller is coupled to the intellectual product circuit modules to select the output of the test results of the intellectual product circuit modules. The registers are coupled to the intellectual product circuit modules to output the stored signals thereto. The MUX finite state machine controller is coupled to the intellectual product circuit module, the multiplexer controller and the registers. The MUX finite state machine controller receives a test pattern and configures the registers in response to the test pattern in different states. In the next state, the MUX finite state machine controller provides a test activating signal to one of the intellectual product circuit modules. According to the output of the registers, the MUX finite state machine controller controls the multiplexer controller, which then selectively outputs the test result.

Both the foregoing general description and the following detailed description are exemplary and explanatory only and are not restrictive of the invention, as claimed.

DESCRIPTION OF THE PREFERRED EMBODIMENTS

Figure 1:
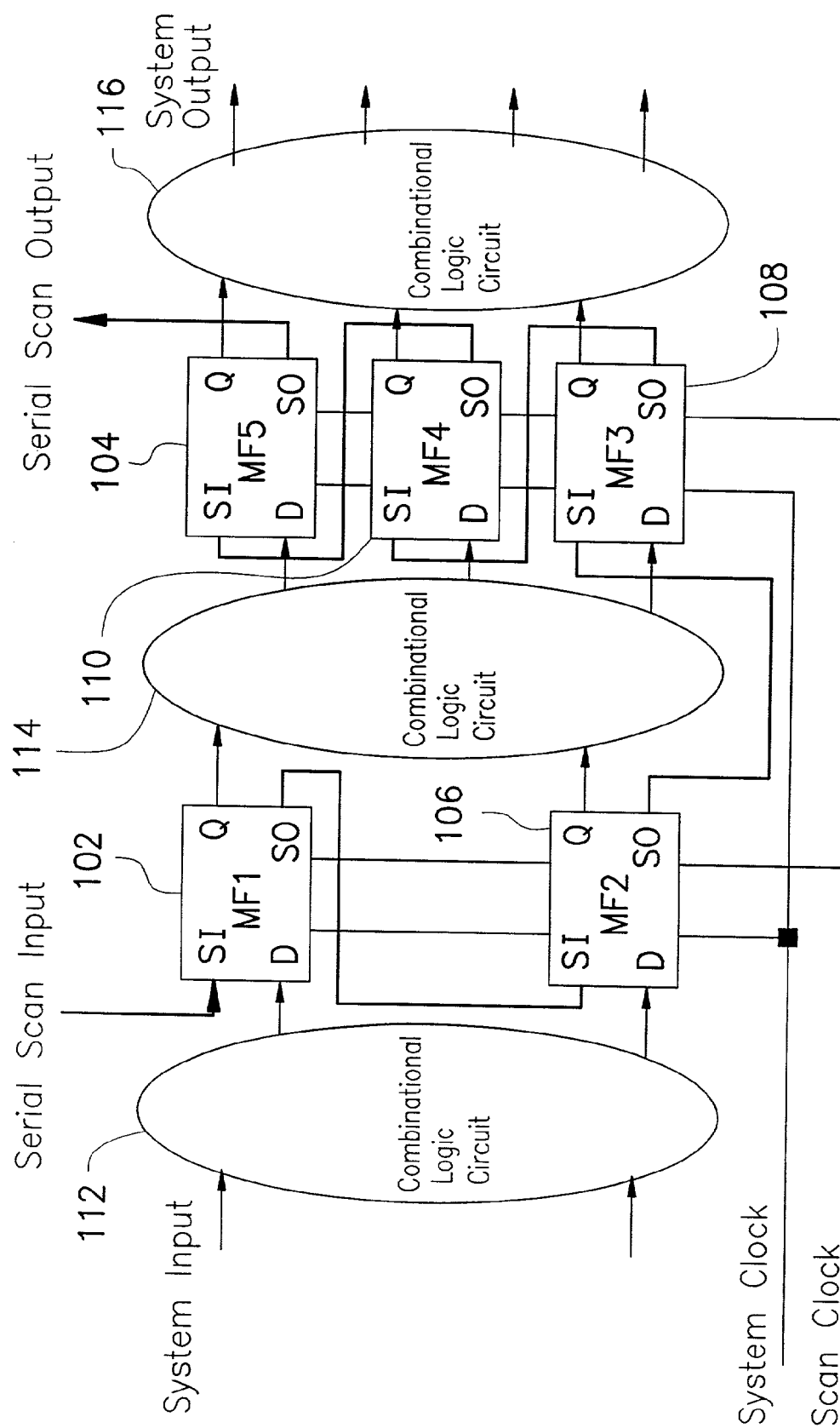
FIG. 1 shows the internal scan chain of a conventional test chip.
Figure 2:
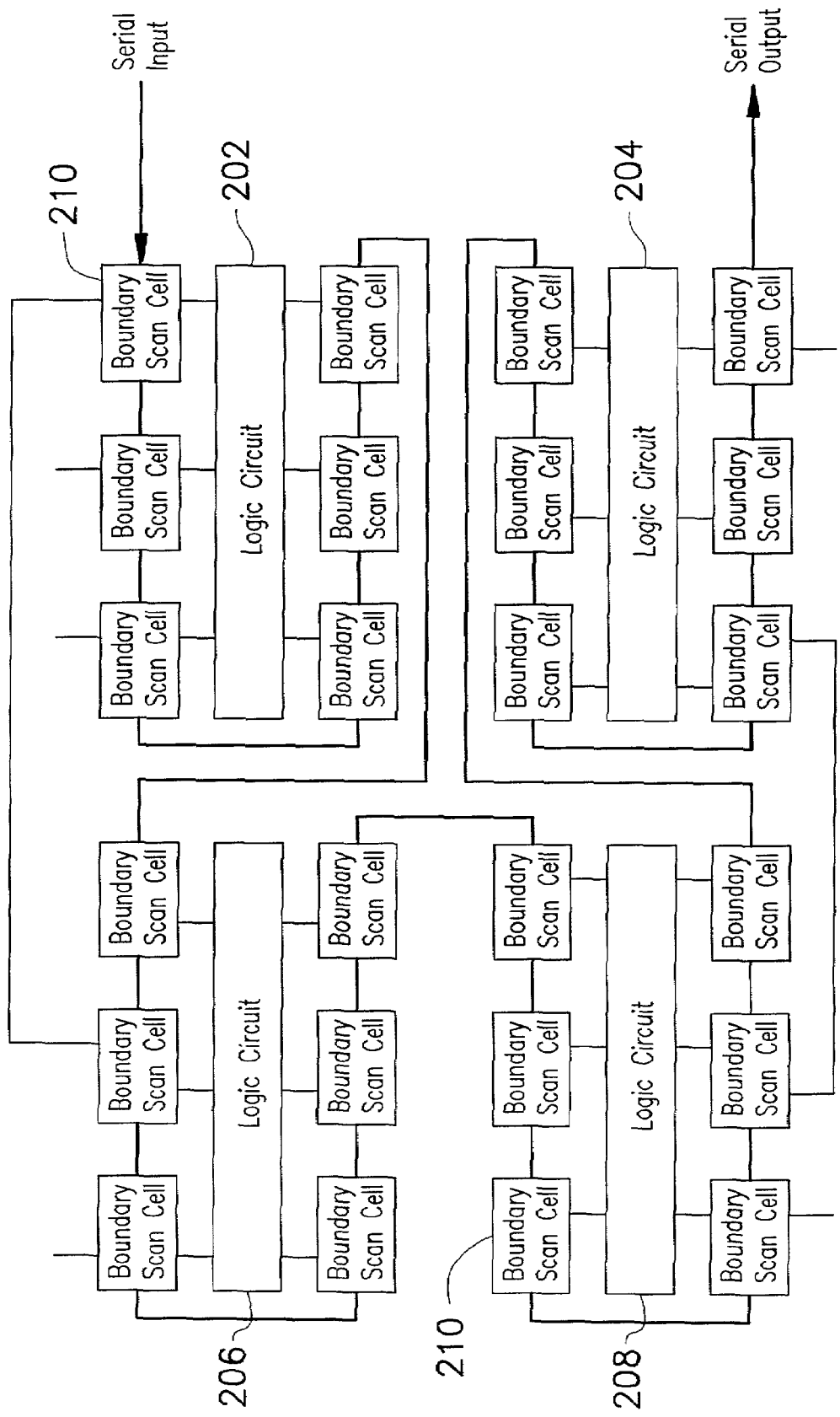
FIG. 2 is a block diagram showing the boundary scan of a conventional test chip.
Figure 3:
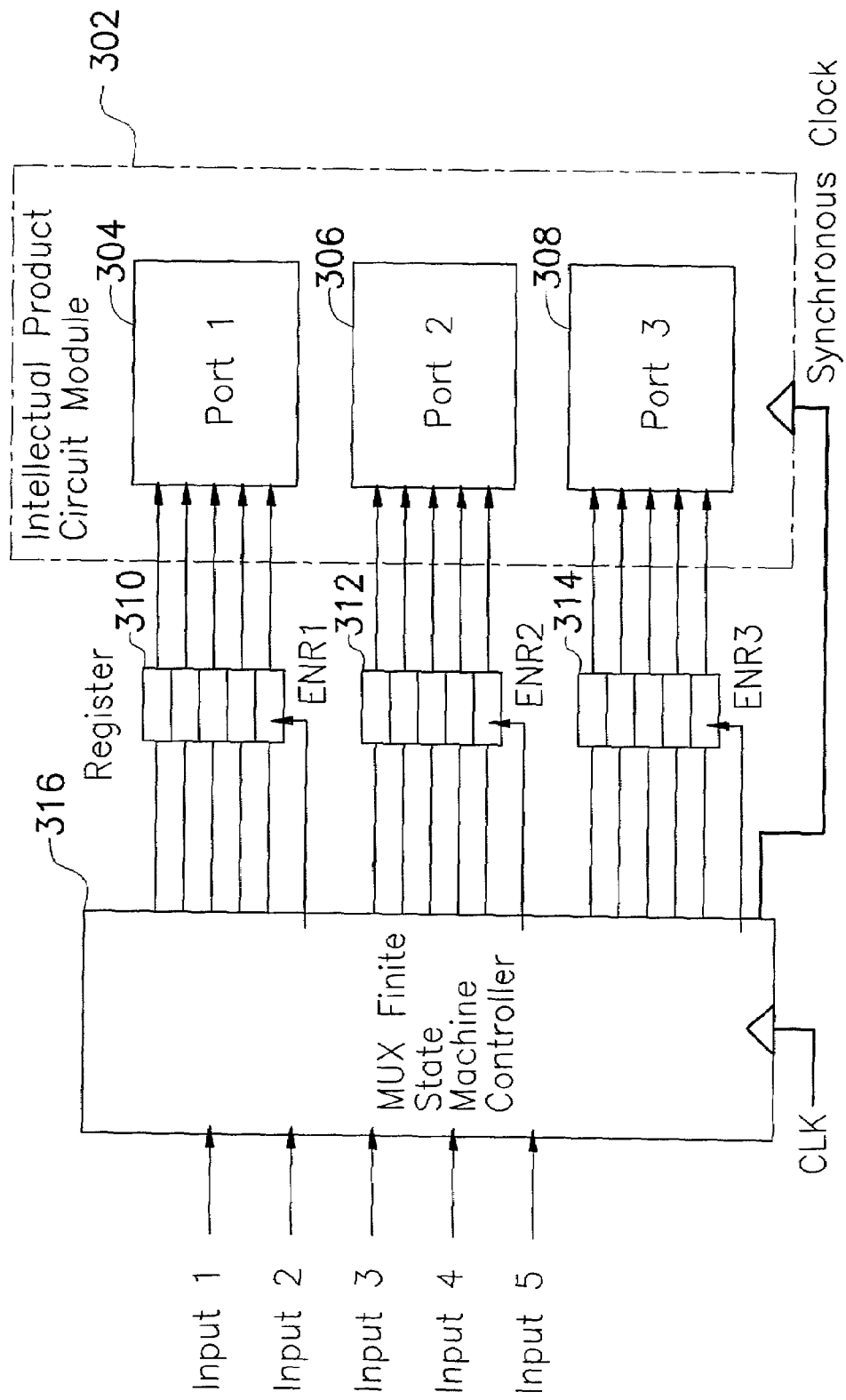
FIG. 3 is a block diagram of a circuit used to test a chip according to the invention.

FIG. 3 shows a block diagram of a circuit for testing a chip. In FIG. 3, the chip comprises an intellectual product circuit module 302, of which the input terminals for receiving the test patterns include port 1 304, port 2 306 and port 3 308.

The registers 310, 312 and 314 are coupled to port 1, port 2 and port 3 of the intellectual product circuit module 302, respectively. The intellectual product circuit module 302 reads the test pattern in the registers 310, 312 and 314. Each of the registers 310, 312 and 314 includes an enable input terminal (ENR1, ENR2 and ENR3 in FIG. 3, respectively) coupled to the MUX finite state machine controller 316. The MUX finite state machine controller 316 controls the registers 310, 312 and 314. When the MUX finite state machine controller 316 asserts the enable signal to the enable terminal of each register, the registers 310, 312 and 314 then buffer the test pattern accordingly.

The MUX finite state machine controller 316 is coupled to the intellectual product circuit module 302 and the registers 310, 312 and 314. The clock terminal CLK of the MUX finite state machine controller 316 receives a clock signal, and the input terminals (Input 1 to Input 5) thereof receive the corresponding data or commands. For example, in a first state, the MUX finite state machine controller 316 stores the test pattern into the register 310. In the second state, the MUX finite state machine controller 316 stores the test pattern into the register 312. In the third state, the MUX finite state machine controller 316 stores the test pattern into the register 314. In the fourth state, the MUX finite state machine controller 316 asserts a test activating signal, such as synchronous clock signal to the synchronous clock terminal of the intellectual product circuit module 302. The intellectual product circuit module 302 is then operated and tested in a time division way according to the stored test patterns in the registers 310, 312 and 314.

In FIG. 3, the number of signal inputs (port 1 304, port 2 306 and port 3 308) of intellectual product circuit module 302, the number of the registers (310, 312 and 314), and the number of states of the MUX finite state machine controller 316 are only examples, not a restriction for the present invention.

Figure 4:
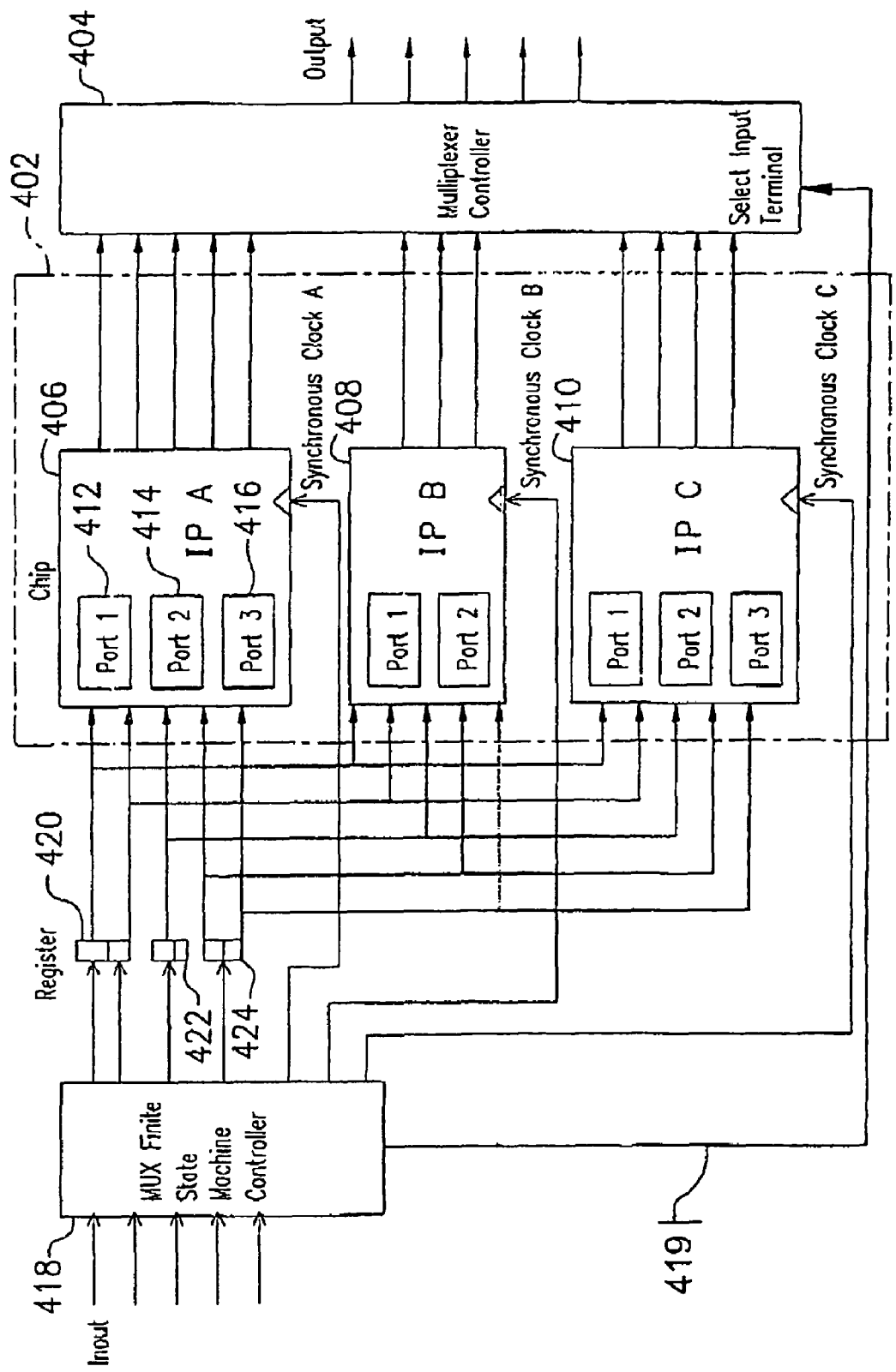
FIG. 4 shows a block diagram of a circuit for testing a chip according to the invention.

FIG. 4 shows a circuit block diagram to test a chip according to another embodiment of the invention. The chip can be a system on chip having several intellectual product circuit modules IPA 406, IPB 408 and IPC 410. The input terminals port 1 412, port 2 414 and port 3 416 of the intellectual product circuit module IPA 406 are used to receive a test pattern. Similarly, the intellectual product circuit modules IPB 408 and IPC 410 include input terminals to receive the test pattern.

In FIG. 4, the circuit comprises a multiplexer controller 404, registers 420, 422 and 424, and a multiplexing finite state machine controller 418. The multiplexer controller 404 is coupled to the intellectual product circuit modules (including IPA 406, IPB 408 and IPC 410). The multiplexer controller 404 comprises a select input terminal to receive a select signal 419 output from the multiplexing finite state machine controller 418, so that the test results output from the IPA 406, IPB 408 and IPC 410 are selectively output.

The registers 420, 422 and 424 are coupled to the intellectual product circuit modules (including IPA 406, IPB 408 and IPC 410) to output the stored test patterns to the intellectual product circuit modules. Each of the registers 420, 422 and 424 comprises an enable input terminal (not shown in FIG. 4). The enable input terminals are coupled to the mutiplexing finite state machine controller 418 such that the registers 420, 422 and 424 are controlled thereby. When the mutiplexing finite state machine controller 418 asserts the enable signals to the enable input terminals of the registers 420, 422 and 424, these registers 420, 422 and 424 then buffer the test patterns accordingly.

The mutiplexing finite state machine controller 418 is also coupled to the intellectual product circuit modules IPA 406, IPB 408 and IPC 410, the multiplexer controller 404 and the registers 420, 422 and 424. Using IPA 406 as an example, the mutiplexing finite state machine controller 418 receives a test pattern at the input terminal. In a first state, the mutiplexing finite state machine controller 418 buffers the test pattern to the register 420. In a second state, the mutiplexing finite state machine controller 418 buffers the test pattern to the register 422. In a third state, the mutiplexing finite state machine controller 418 buffers the test pattern to the register 424. In a fourth state, the mutiplexing finite state machine controller 418 asserts a test activating signal, such as synchronous clock signal A to the clock input terminal of the IPA 406. The port of the IPA is enabled, and the mutiplexing finite state machine controller 418 enables the IPA 406 to be operated according to the test patterns output from the registers 420, 422 and 424. The mutiplexing finite state machine controller 418 controls the multiplexer controller 404 to output the test results of the IPA 406 by the multiplexer controller 404.

By testing another IP as an example, in a fifth state, the mutiplexing finite state machine controller 418 buffers a test pattern in the register 420. In a sixth state, the mutiplexing finite state machine controller 418 buffers a test pattern in the register 422. In a seventh state, the mutiplexing finite state machine controller 418 buffers a test pattern in the register 424. In an eighth state, the mutiplexing finite state machine controller 418 asserts a synchronous clock signal B to the clock input terminal of the IPB 408 to enable the ports of the IPB 408, such that the IPB 408 operates according to the test patterns output by the registers 420, 422 and 424. The mutiplexing finite state machine controller 418 controls the multiplexer controller 404 to selectively output the test results of the IPB 408. Thus, the above intellectual product circuit modules including IPA 406, IPB 408 and IPC 410 are tested in a time division way.

In FIG. 4, the IPA number of intellectual product circuit modules, the signal input terminals of IPA, the number of registers and the number of states of the mutiplexing finite state machine controller are only example of the invention. Other combination of the above numbers can be applied to the invention without departing from the spirit and scope of the invention.

Therefore, the invention has an advantage of providing a method and a circuit to test a chip that can easily generate a test pattern for testing a chip with reduced testing time for modifying the test patterns. Consequently, the test cost is reduced. Furthermore, without sacrificing the product performance, the chip area required by the test circuit is reduced. In addition, the test circuit can be easily applied to the integrated circuit of the chip.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of testing a chip that comprises intellectual product circuit modules, the method comprising:
   providing a test pattern;
   sequentially enabling a common storage device to store the test pattern based on a plurality of different states; and
   after the test pattern is stored in the common storage device, selecting one of the intellectual product circuit modules according to the test pattern for testing by providing a test activating signal using a synchronous clock signal to the selected intellectual product circuit module in a next state, so that the selected intellectual product circuit module is operated and tested according to the test pattern from the common storage device.

2. A circuit for testing a chip that comprises an intellectual product circuit module, the circuit for testing the chip further comprising:
   a common storage device coupled to the intellectual product circuit module; and
   an input signal selector, coupled to the intellectual product circuit module and the common storage device, wherein
   the input signal selector receives a test pattern and sequentially enables the common storage device to store the test pattern based on a plurality of different states, after all of the test pattern is stored in the common storage device, in a next state the input signal selector further provides a test activating signal using a synchronous clock signal to the intellectual product circuit module so that the intellectual product circuit module is operated and tested according to outputs of the common storage device.

3. The circuit according to claim 2, wherein the intellectual product circuit module further comprises a plurality of ports coupled to the common storage device.

4. The circuit according to claim 2, wherein the common storage device further comprises an enable input terminal coupled to the input signal selector capable of controlling the common storage device and asserting an enable signal to enable the common storage device to buffer the test pattern.

5. A circuit for testing a chip that comprises a plurality of intellectual product circuit modules, the circuit comprising:
   an output selector, coupled to the intellectual product circuit modules to selectively output a test result from the intellectual product circuit modules;
   a common storage device, coupled to the intellectual product circuit modules to output signals stored in the common storage device to the intellectual product circuit modules; and
   a input signal selector, coupled to the intellectual product circuit modules, the output selector and the common storage device, the input signal selector for receiving a test pattern and sequentially enabling the common storage device to store the test pattern based on a plurality of different states of the input signal selector, and after all of the test pattern is stored in the common storage device, selecting one of the intellectual product circuit modules according to the test pattern for testing by providing a test activating signal using a synchronous clock signal to the selected one of the intellectual product circuit modules in a next state, so that the selected intellectual circuit module is operated and tested according to the output of the common storage device, and the input signal selector further controlling the output selector to selectively output the test results.

6. The circuit according to claim 5, wherein each of the intellectual product circuit modules comprises a plurality of ports coupled to the common storage device.

7. The circuit according to claim 5, wherein the output selector further comprises a select input terminal coupled to the input signal selector, so that the input signal selector controls the output selector to selectively output the test result.

8. The circuit according to claim 5, wherein the common storage device further comprises an enable input terminal coupled to the input signal selector, which respectively controls and enables the common storage device to buffer the test pattern.

9. The circuit according to claim 5, wherein the chip is a system on chip.

* * * * *